United States Patent [19]

Glover et al.

[11] Patent Number: 4,950,994
[45] Date of Patent: Aug. 21, 1990

[54] GRADIENT AND POLARIZING FIELD COMPENSATION

[75] Inventors: Gary H. Glover, Delafield; Norbert J. Pelc, Wauwatosa, both of Wis.; Kenneth Marel Bradshaw, Idaho Falls, Id.

[73] Assignee: General Electric Company, Milwaukee, Wis.

[21] Appl. No.: 164,687

[22] Filed: Mar. 7, 1988

[51] Int. Cl.$^5$ .................................... G01R 33/22
[52] U.S. Cl. ................................. 324/320; 324/318
[58] Field of Search ............ 324/322, 321, 320, 319, 324/318, 314, 307

[56] References Cited

U.S. PATENT DOCUMENTS

| | | | |
|---|---|---|---|
| 4,585,995 | 4/1986 | Flugan | 324/322 |
| 4,698,591 | 10/1987 | Glover et al. | 324/318 |
| 4,703,275 | 10/1987 | Holland | 324/322 |
| 4,733,342 | 3/1988 | Mueller et al. | 324/322 |
| 4,761,612 | 8/1988 | Holland et al. | 324/322 |

Primary Examiner—Stewart J. Levy
Assistant Examiner—Louis M. Arana
Attorney, Agent, or Firm—Barry E. Sammons; Douglas E. Stoner

[57] ABSTRACT

A method is provided for characterizing the spurious, time dependent magnetic field gradient response and for compensating therefor. In accordance with the method, two small sample objects are placed at two positions with respect to the system isocenter where the gradient to be compensated has different values. A magnetic field gradient pulse is applied to the sample, followed by the application after a variable time of a 90° radio frequency pulse. The phase of the resulting free induction decay (FID) signal is monitored as a function of total time since the end of the gradient pulse. These data are related to the impulse response of the gradient and are employed to construct compensation filters for both the gradient coils and the polarizing field shim coil.

10 Claims, 5 Drawing Sheets

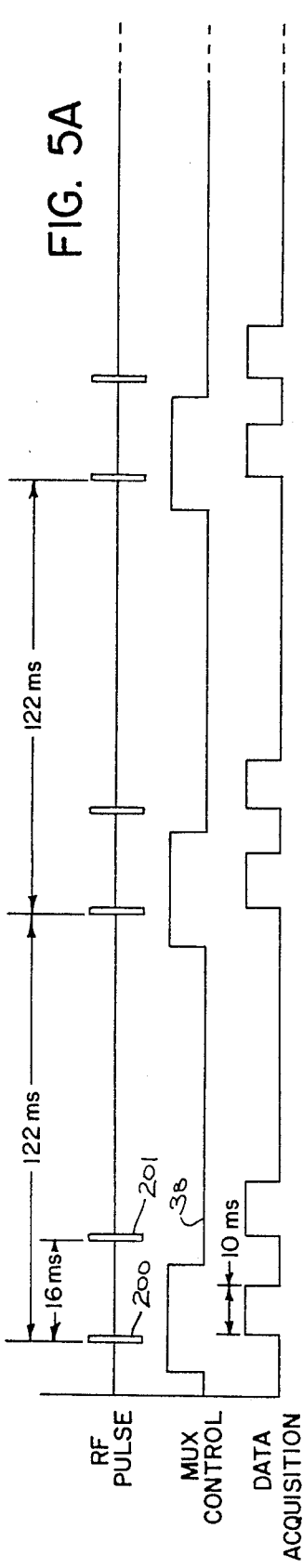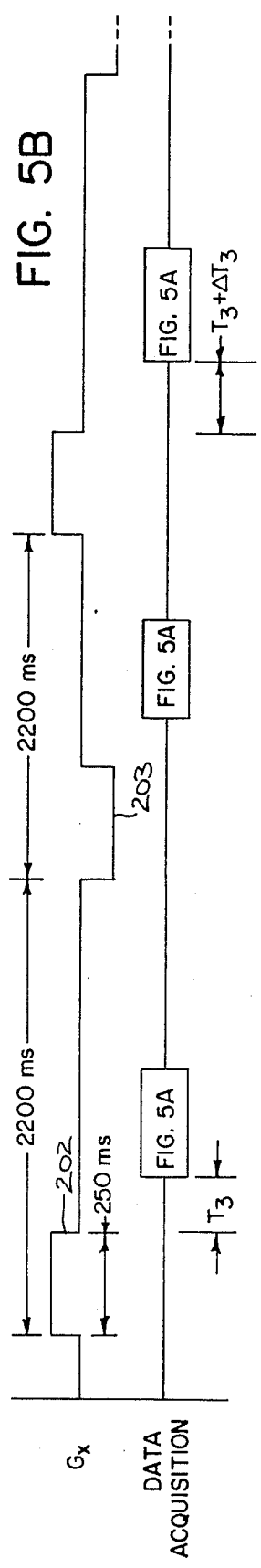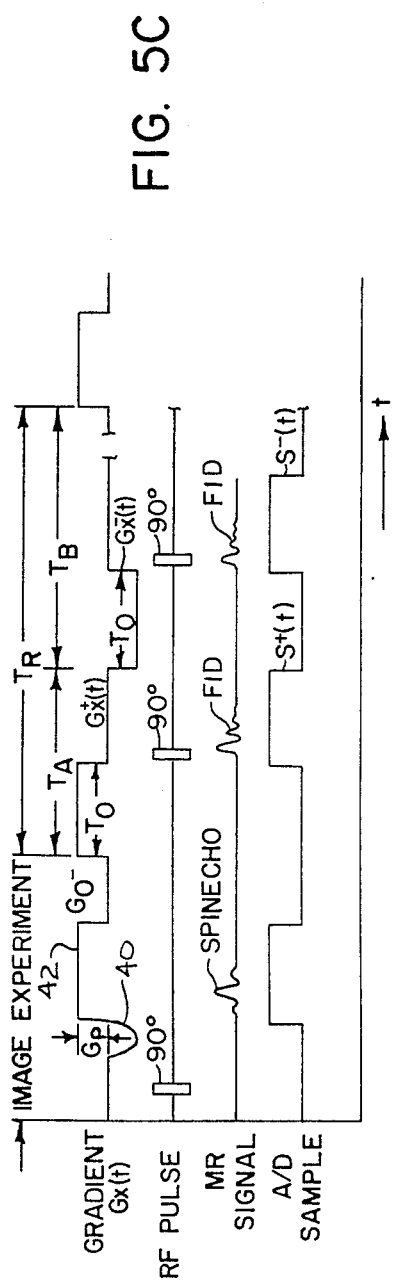

GRADIENT AND POLARIZING FIELD COMPENSATION

BACKGROUND OF THE INVENTION

This invention relates to magnetic resonance (MR) techniques. More specifically, this invention relates to the compensation of magnetic fields to overcome distortions caused by the application of pulsed magnetic field gradients. The invention is particularly applicable to magnetic resonance imaging, but is not limited thereto.

The nuclear magnetic resonance (NMR) phenomenon has been utilized in the past in high resolution magnetic resonance spectroscopy instruments by structural chemists to analyze the structure of chemical compositions. More recently, MR has been developed as a medical diagnostic modality having applications in imaging the anatomy, as well as in performing in vivo, noninvasive spectroscopic analysis. As is now well known, the MR phenomenon can be excited within a sample object, such as a human patient, positioned in a homogeneous polarizing magnetic field, $B_o$, by irradiating the object with radio frequency (RF) energy at the Larmor frequency. In medical diagnostic applications, this is typically accomplished by positioning the patient to be examined in the field of an RF coil having a cylindrical geometry, and energizing the RF coil with an RF power amplifier. Upon cessation of the RF excitation, the same or different RF coil is used to detect the MR signals, frequently in the form of spin echoes, emanating from the patient lying within the field of the RF coil. In the course of a complete MR scan, a plurality of MR signals are typically observed. The signals are used to derive MR imaging or spectroscopic information about the object studied.

The application of magnetic resonance to imaging, and to many of the techniques of localized spectroscopy, depend upon the use of magnetic field gradients to selectively excite particular regions and to encode spatial information within the NMR signal. During the NMR experiments, magnetic field gradient waveforms with particularly chosen temporal variations are used. Any departure from the application of ideal magnetic field gradient waveforms can, therefore, be expected to introduce image distortion. For example, imperfect rephasing of the nuclear spins and an attendant loss of signal occurs if the magnetic field gradients are not constant during selective time reversal pulses (i.e. use of 180° time reversal RF pulses). This effect compounds in later spin echoes of multi-echo (Carr-Purcell-Meiboom-Gill) sequences. In addition, if the gradient field is not zero when it should be (due to residual decay after termination of a gradient pulse), the unintended phase dispersion can result in distorted spectra in chemical shift imaging (CSI) sequences as well as inaccurate spin-spin relaxation time ($T_2$) determination in multi-echo sequences. Those skilled in the art are thus concerned particularly about the accuracy with which time varying magnetic field gradients are produced.

Distortions in the production of magnetic field gradients can arise if the gradient fields couple to lossy structures within the polarizing magnet such as its cryostat (if the magnet is of the superconductive design), or the shim coil system, or the RF shield used to decouple the gradient coils from the RF coil. The gradient distortions derive from induction of currents in these ambient structures, from the loss of energy to the shim coils or from an active response of the shim power supplies to the sensed gradient field. One observes, typically, an approximately exponential rise and decay of the magnetic field gradient during and after, respectively, the application of a rectangular current pulse to the gradient coil.

In pending U.S. patent application Ser. No. 816,074, now U.S. Pat. No. 4,698,591 which was filed on Jan. 3, 1986, and which is entitled "A Method for Magnetic Field Gradient Eddy Current Compensation," a method is disclosed which uses an analog preemphasis filter in the gradient power supply to shape the current applied to the gradient coil in such a way that the gradient field distortions are reduced. The filter includes a number of exponential decay components and adjustable potentiometers which must be set during system calibration. A measurement technique is used prior to system calibration in which the impulse response of the uncorrected magnetic field gradient is measured and the potentiometer settings for the pre-emphasis filter are then calculated.

It has been discovered that while such compensation of the magnetic field gradients improves performance of MR systems, distortions still arise as a result of the application of pulsed magnetic field gradients. More specifically, measurements indicate that eddy currents which are induced by magnetic field gradient pulses not only produce an unwanted magnetic field gradient field, but also cause temporal variations in the spatially homogeneous polarizing magnetic field $B_o$. That is, magnetic field gradient pulses cause spurious changes in the magnitude of the polarizing magnetic field $B_o$. The degree to which these distortions occur depends to a certain extent on the construction of the magnet and coil. For example, accurate alignment of the gradient coils with respect to the magnet structure reduces the distortion. In addition, the degree to which these distortions affect the results depends on the nature of the particular MR measurement being conducted. For example, MR scans in which the imaging magnetic field gradient pulses are changed in a nonmonotonic manner are affected more than conventional scans.

SUMMARY OF THE INVENTION

The present invention is a method for measuring the spurious effects, on both the time dependent magnetic field gradient field and the time varying homogeneous magnetic field caused by magnetic field gradient pulses, and for providing compensation so as to reduce the production of these fields. In accordance with the method, a small sample object is placed at each of two positions away from the isocenter of the gradient field to be compensated. For each position, a magnetic field gradient pulse is applied and is followed by a radio frequency excitation pulse. The resulting NMR signals are acquired and analyzed to produce an indication of the spurious magnetic field at each position. These measurements, in turn, can be used to estimate the impulse response of both the gradient magnetic field and the homogeneous magnetic field to excitation of the gradient coils. The measured impulse response is then employed to provide a more accurate compensation circuit for the gradient field power supply and a compensation circuit for the power supply which drives a coil that produces a homogeneous magnetic field.

A general object of the invention is to reduce the spurious distortion of the magnetic field gradients and homogeneous magnetic field due to eddy currents induced by the application of magnetic field gradient pulses. By acquiring data from samples located at two positions within the magnetic field gradient, sufficient information is obtained to calculate the spurious distortions in both the gradient and homogeneous fields. This information is then employed to provide the proper compensation circuits.

Another object of the invention is to compensate the homogeneous magnetic field for spurious distortions caused by changes in the magnetic field gradients. The polarizing magnetic field is produced by a main magnet and a $B_o$ shim magnet. The magnitude of the field produced by the $B_o$ shim magnet is typically controlled to compensate for drift of the polarizing magnetic field. In accordance with the present invention, the power supply for the $B_o$ shim magnet includes a compensation circuit which applies current to the shim magnet such that its magnetic field offsets the spurious distortions caused by gradient field pulses.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent a full scope of the invention, however, and reference is made therefore to the claims herein for interpreting the scope of the invention.

BRIEF DESCRIPTION OF THE DRAWINGS

FIGS. 5A and 5B shows a preferred embodiment of a pulse sequence for measuring the impulse response to a gradient pulse along one axis;

FIG. 5C depicts a preferred embodiment of a pulse sequence for measuring the position of the samples along one axis;

DETAILED DESCRIPTION OF THE INVENTION

Figure 1:
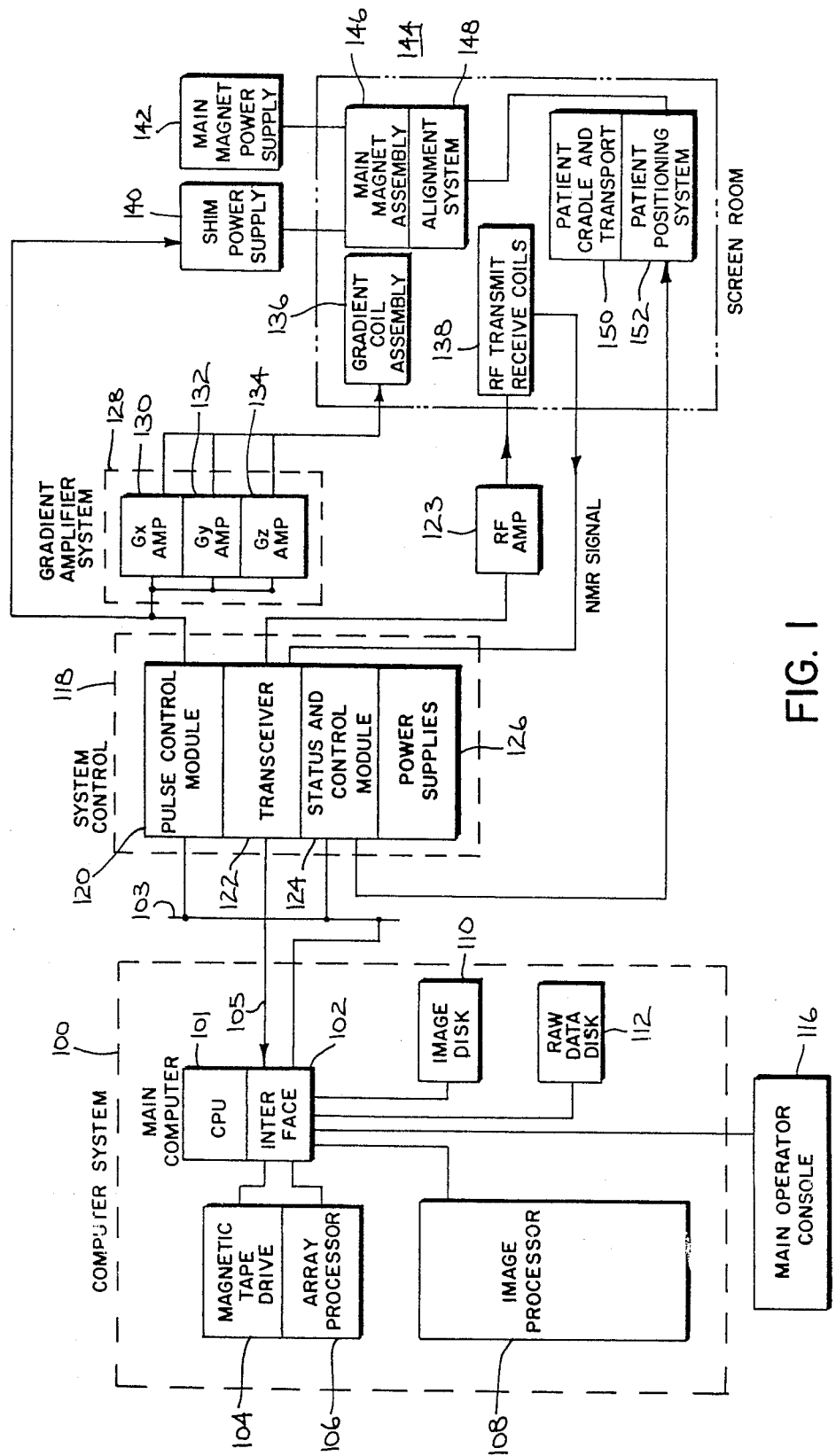
FIG. 1 is a block diagram of an exemplary MR system.

Referring first to FIG. 1, there is shown in block diagram form the major components of an exemplary MR system. The overall operation of the system is under the control of a host computer system generally designated 100 which includes a main computer 101 (such as a Data General MV4000). The computer has associated therewith an interface 102 through which a plurality of computer peripheral devices and other MR system components are coupled. Among the computer peripheral devices is a magnetic tape drive 104 which may be utilized under the direction of the main computer for archiving patient data and images to tape. Processed patient data may also be stored in an image disc storage device designated 110. An array processor 106 is utilized for preprocessing data and for image construction. The function of image processor 108 is to provide interactive image display manipulation such as magnification, image comparison, and gray-scale adjustment. The computer system is provided with a means to store raw image data (i.e. before image construction) utilizing a disc data storage system designated 112. An operator console 116 is also coupled to the computer by means of interface 102 and provides the operator with the means to input data pertinent to a patient study as well as control commands necessary for proper MR system operation, such as initiating and terminating scans. The operator console may also be used to display images stored on discs or magnetic tape.

The computer system exercises control over the MR system by means of system control 118 and gradient amplifier system 128. The computer communicates with system control 118 by means of a digital communication network 103 (such as the Ethernet network) in a manner well known to those skilled in the art. The system control includes several subsystems such as the pulse control module (PCM) 120, a radio frequency transceiver 122, a status control module (SCM) 124, and the power supplies generally designated 126 necessary to energize the components. The PCM utilizes control signals provided by computer 101 to generate digital timing and control signals such as the current waveforms used for gradient coil excitation, as well as RF envelope waveforms utilized in the transceiver for modulating RF pulses. The gradient waveforms are applied to the gradient amplifier system 128 generally comprised of $G_x$, $G_y$ and $G_z$ amplifiers 130, 132 and 134, respectively, each utilized to excite a corresponding gradient coil in an assembly generally designated 136 and which is part of a magnet assembly 146. When energized, the gradient coils generate substantially constant magnetic field gradients $G_X$, $G_Y$ and $G_Z$ of the magnetic field in the same direction as the main polarizing magnetic field, wherein the gradients are directed in mutually orthogonal X-, Y- and Z-axis directions of a Cartesian coordinate system. That is, if the magnetic field generated by the main magnet (no is directed in the z direction and is termed $B_o$, and the total magnetic field in the z direction is referred to as $B_z$, then $G_x = \partial B_z / \partial x$, $G_y = \partial B_z / \partial y$ and $G_z = \partial B_z / \partial z$, and the magnetic field at any point (x, y, z) is given by $B(x, y, z) = B_O + G_X x + G_y y + G_z z$. The $G_X$ gradient has no effect on the plane x=0. Similarly, $G_y$ and $G_z$ have no effect on the planes y=0 and z=0, respectively. The point (0, 0, 0) is termed "isocenter" and is the point in space where none of the gradients have any effect. Isocenter is normally situated substantially at the center of the active volume of the main magnetic field.

The gradient magnetic fields are utilized in combination with radio frequency pulses generated by transceiver 122, RF amp 128 and RF coil 138 to encode spatial information into the MR signals emanating from the region of the patient being studied. Waveforms and control signals provided by the pulse control module 120 are utilized by the transceiver subsystem 122 for RF carrier modulation and mode control. In the transmit mode, the transmitter provides a radio frequency carrier waveform modulated in accordance with the control signals to an RF power amplifier 123 which then energizes RF coils 138 which are situated within main magnet assembly 146. The NMR signals radiated by the excited nuclei in the patient are sensed by the same or a different RF coil than is used for transmitting. The signals are detected, amplified, demodulated, filtered, and digitized in the receiver section the transceiver 122. The processed signals are transmitted to the main computer 101 for processing by means of a dedicated, unidirectional, high-speed digital link 105 which links interface 102 and transceiver 122.

The PCM and SCM are independent subsystems both of which communicate with main computer 101, peripheral systems, such as patient positioning system 152, as well as to one another by means of link 103. The PCM and SCM are each comprised of a 16-bit microprocessor (such as an Intel 8086) for processing commands from the main computer. The SCM includes means for acquiring information regarding patient cradle (not shown) position, and the position of the moveable patient alignment light fan beam (not shown). This information is used by main computer 101 to modify image display and construction parameters. The SCM also initiates functions such as actuation of the patient transport and alignment systems.

The gradient coil assembly 136 and the RF transmit and receiver coils 138 are mounted within the bore of the magnet utilized to produce the polarizing magnetic field. The magnet forms a part of the main magnet assembly which includes the patient alignment system 148, a shim coil power supply 140, and a main magnet power supply 142. The shim power supply 140 is utilized to energize shim coils associated with the main magnet and which are used to correct inhomogeneities in the polarizing magnetic field. As will be described in more detail below, the shim power supply 140 also receives gradient field pulses from the pulse control module 120 and it uses these pulses to generate a current waveform which, when applied to the $B_o$ shim coil, compensates for the changes induced by the gradient fields in accordance with the teaching of this invention. In the case of a resistive magnet, main magnet power supply 142 is utilized to continuously energize the magnet. In the case of a superconductive magnet, the main magnet power supply 142 is utilized to bring the polarizing field produced by the magnet to the proper operating strength and is then disconnected. In the case of a permanent magnet, power supply 142 would not be needed. The patient alignment system 148 operates in combination with a patient cradle and transport system 150 and patient positioning system 152. To minimize interference from external sources, the MR system components comprised of the main magnet assembly, the gradient coil assembly, and the RF transmit and receiver coils, as well as the patient-handling devices, are enclosed in an RF-shielded room generally designated 144. The shielding is generally provided by a copper or aluminum screen network which encloses the entire room. The screen network serves to contain the RF signals generated by the system, while shielding the system from RF signals generated outside the room. A bi-directional attentuation of approximately 100 db. is typical in the frequency range of operation.

Figure 2A:
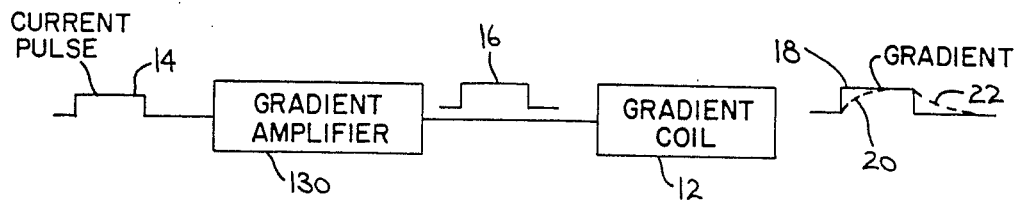
FIG. 2A shows in greater detail the conventional gradient amplifier and gradient coil chain.

Referring now to FIG. 2A, there is shown gradient amplifier 130 (also shown in FIG. 1) for energizing a gradient coil 12 to produce the $G_x$ gradient. Under ideal operating conditions, when a rectangular current pulse 14 is applied to amplifier 130, as indicated at 16, a substantially rectangular magnetic field gradient pulse 18 is produced. However, because of the coupling to lossy structures and the resulting production of spurious magnetic field components, the resulting magnetic field gradient has a finite rise time as indicated at 20, and a finite decay as indicated at 22. As indicated above, such gradient field distortions can lead to loss of signal and unintended phase dispersion.

Figure 2B:
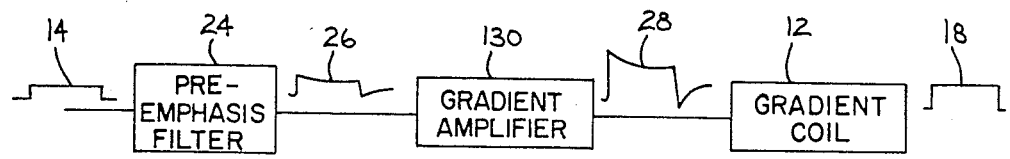
FIG. 2B illustrates a gradient amplifier and coil chain in which in accordance with one embodiment of the invention a pre-emphasis filter precedes the gradient amplifier.

In accordance with one embodiment of the invention, these gradient field distortions can be reduced by application of a current pulse 14, as shown in FIG. 2B, to a preemphasis filter 24 to predistort the current pulse, as indicated at 26. As a result, the amplified current pulse 28 applied to the gradient coil 12 produces the desired rectangular magnetic field gradient pulse 18. Since in typical MR applications, gradient pulses are applied in at least each of the axes of the Cartesian coordinate system, an MR system for practicing the invention would have means functionally similar to that depicted in FIG. 2B to achieve correction along all axes. However, for simplicity, the following discussion will refer to correction along only one of the axes.

Figure 2C:
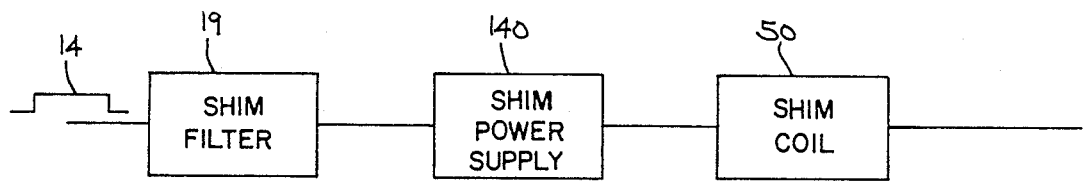
FIG. 2C illustrates a shim coil and power supply which is compensated according to the present invention.

Referring to FIG. 2C, the $B_0$ shim power supply is within the shim power supply 140 which is shown connected to a shim coil 50. The power supply 140 receives an input signal from a shim filter 19, which in turn receives the gradient pulses 14 at its input. The shim filter 19 is constructed, as will be described in more detail below, to produce impulse response correction signals for the shim power supply. These correction signals momentarily reduce or increase the current produced by the $B_0$ shim power supply to thereby reduce or increase the uniform polarizing magnetic field produced in part by the shim coil 50. These corrections offset the momentary increases and decreases in the homogeneous magnetic field caused by the magnetic field gradient pulses.

In order to determine how current pulse 14 in FIG. 2B and the current pulse in FIG. 2C should be shaped and, therefore, how pre-emphasis filter 24 and shim filter 19 should be constructed to achieve the desired shape, the nature of the distortion to be eliminated must first be measured and analyzed. The manner in which this is accomplished using an MR system will be described next.

Figure 3A:
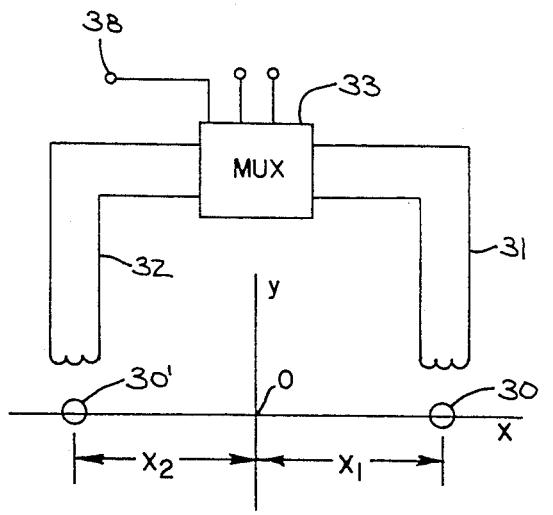
FIG. 3A depicts two samples positioned away from the isocenter of an MR system.
Figure 3B:
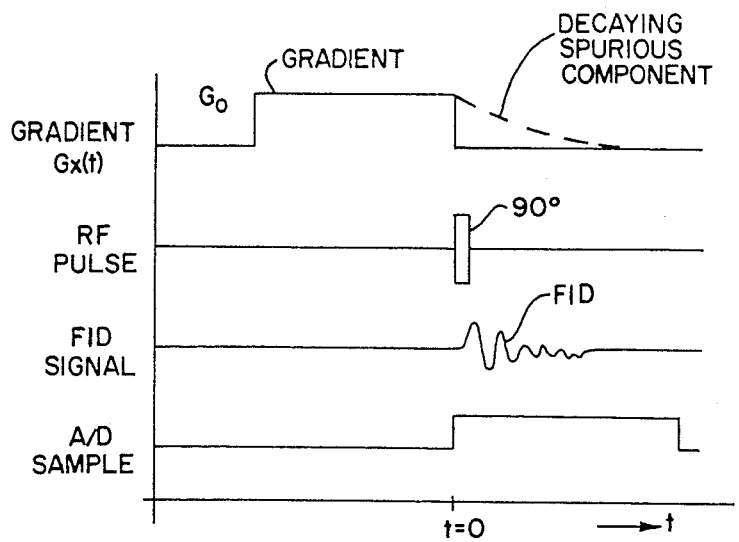
FIG. 3B depicts an exemplary pulse sequence in accordance with the invention for measuring the spurious component produced by a gradient pulse along one axis.

FIG. 3A depicts samples 30 and 30', each composed of an MR active substance, for example, a ¼ inch diameter acrylic tube containing approximately 0.4 cc of 0.5M CuSO4 doped water positioned respectively at a distance "$x_1$" and "$x_2$" from the gradient origin designated "0" (that is, the system isocenter). Samples 30 and 30' serve as the source of the NMR signals used to measure the distortions caused by magnetic field gradient pulses $G_x$. FIG. 3B shows the pulse sequence employed to produce the NMR signals (FID) for one sample 30 or 30' and for one axis. As previously indicated, the sequence is repeated for other axes along which gradients requiring compensation are applied. Also, as shown in FIG. 3A, each sample 30 and 30' is surrounded by a separate local coil 31 and 32 which is sensitive only to the NMR signal produced by its associated sample. The coils 31 and 32 connect to a multiplexer 33 which switches back and forth between the coils 31 and 32 during the scan to enable NMR data to be separately acquired from each sample during a single sequence. The output of the multiplexer 33 connects to the transceiver 122 as shown in FIG. 1.

As shown in FIG. 3B, the measurement sequence is comprised of a gradient pulse followed by the application of a 90° RF pulse which generates a free induction decay (FID) signal. If there are no spurious magnetic field components produced after the gradient pulse terminates, then the sample object will be immersed in a homogeneous, constant magnetic field for the entire duration of the FID. As a result, the instantaneous frequency of the FID will be constant as a function of time. If, however, the gradient pulse is followed by spurious magnetic field components as shown by the dashed curve in FIG. 3B, then the magnetic field at the sample object will vary during the FID and so will the instantaneous phase and frequency of the FID signal. The resulting free induction decay signal will contain phase information whose instantaneous value at time "t" depends on the time integral of the spurious magnetic field gradient components produced after the application of the 90° RF pulse.

The FID signal S(t), which is obtained from a sample with one dimensional density distribution P(x) (i.e. integrated over the y and z directions) and spin-spin relaxation time $T_2(x)$ is:

$$S(t) = \int P(x) e^{-t/T_2} e^{[i\gamma x\{\int_o^t B(t')dt'\} + i\Delta\omega t]} dx \quad (1)$$

where: $\gamma$ is the gyromagnetic ratio, B(t) is the sum of the gradient field response (G(t)) and the spatially homogeneous field response ($B_o(t)$); and $\Delta\omega$ is a constant resonance frequency offset which is discussed in more detail below. If the sample object is small, the phase of the signal S(t) is:

$$\Phi(t) = \gamma x \int_o^t B(t')dt' + i\Delta\omega t. \quad (2)$$

It is seen that the phase of the FID signal contains information about the response B(t) and that B(t) can, therefore, be calculated directly by taking the derivative of the phase signal. The present invention utilizes this information to characterize the spurious response of the system to field gradient pulses. A further goal is to use the measured information to precompensate the gradient amplifier's current waveforms so as to produce the desired gradient fields and to characterize the shim filter such that the effects of $B_o(t)$ on the polarizing field can be offset. Thus, in principle one need merely extract the phase from the FID signal as a function of time in order to characterize the spurious field B(t). In practice, however, phase dispersion due to both constant $B_o$ inhomogeneity as well as from the gradient induced inhomogeneity can lead to a $T_2^*$ decay much shorter than the characteristic decay times of the spurious field. As a result, the FID signal will decay before the full spurious component of the B(t) curve can be measured. As a result of the $T_2^*$ decay, a single experiment such as is shown in FIG. 3B can only characterize the gradient field for a time comparable to $T_2^*$.

This problem is overcome by concatenating the data acquired from a series of measurements. During the initial measurement, the 90° RF pulse follows the gradient pulse after essentially no delay, and the FID is measured for a time $T_{AD}$ msec. ($T_{AD} \leq T_2^*$) immediately following the RF pulse. This measurement provides data that characterizes the gradient field for the first $T_{AD}$ msec. after the current pulse is shut off. Now during subsequent measurements the application of the 90° RF pulse is delayed by $T_3$ msec. after the gradient current pulse is shut off. The FID is acquired for another $T_{AD}$ msec. interval after the RF pulse. If $T_3 < T_{AD}$, it will be possible to combine the data from this and the previous ($T_3 = 0$) experiment to allow the gradient field to be characterized for a longer period of time. This process can be repeated so that data is acquired over a long time interval and the full spurious response can be measured.

Figure 4A:
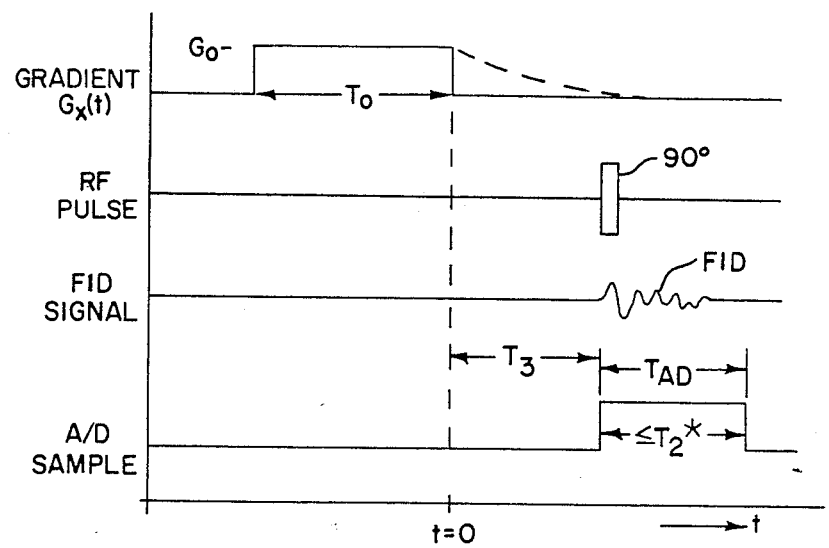
FIGS. 4A and 4B are similar to FIG. 3B and depict inventive pulse sequences suitable for measuring the spurious gradient response.
Figure 4B:
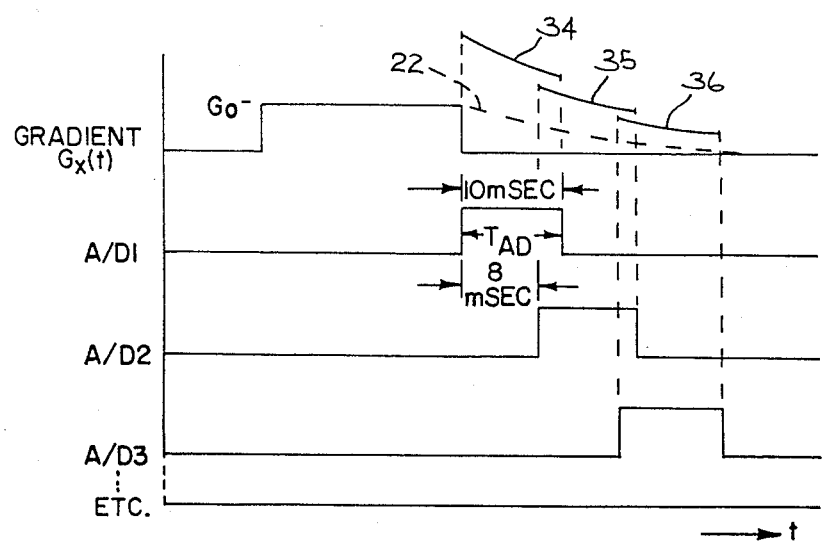

The sequence of FIG. 3B is therefore modified as shown in FIG. 4A so that a variable time delay $T_3$ is inserted between the gradient and 90° RF pulse. A number of short acquisitions of length $T_{AD} \leq T_2^*$ are then obtained with $T_3$ incremented by $\Delta T_3$ between acquisitions. In this way, the entire spurious gradient decay can be swept through the A/D acquisition window in small overlapping segments. In one implementation, $T_{AD}$ was selected to be 10 msec., while the change in the delay between segments was 8 msec. as shown in FIG. 4B, in which A/D$_1$, A/D$_2$, etc., indicate adjacent, overlapping segments in sampling the gradient spurious response curve. The total data set represented by curve 22 is then obtained by combining, or concatenating, the separate acquisitions 34, 35 and 36 shown in FIG. 4B. Since the spurious field is proportional to the derivative of the total data set, offsets between acquisitions are of no consequence.

In the analysis of the phase data from each acquisition and in the process of combining the data from the various acquisitions, use is made of the fact that $\Phi(t)$ (Equation (2)) is continuous. Thus, even though the phase at any single point in time can only be calculated modulo $2\pi$, values $\Phi(t)$ much greater than $2\pi$ can be measured by "unwrapping" the measured phase. Similarly, the various segments are combined by forcing the derivative of $\Phi(t)$ to be continuous at the segment boundaries. In order to better match the segments at the boundaries, it is advantageous to overlap the segments somewhat.

If the time course of the spurious field is long compared to the relaxation times ($T_1$ and $T_2$) of the sample, a further efficiency gain can be achieved. For example, suppose that the spurious field must be measured for 2 seconds after the gradient pulse and the gradient pulses cannot, therefore, be closer than 2 seconds apart. If the 10 msec. acquisition window is to be swept across the entire 2 second span, the process would be quite long. However, if the relaxation time of the sample is short, say 30 msec., then several NMR experiments can be executed after each gradient pulse. For example, 16 NMR experiments at 122 msec. intervals can be executed after a single gradient pulse and each yields a 10 msec. window of spurious gradient decay data. The entire train of 16 NMR experiments is then repeated with a programmed delay with respect to the gradient pulse. This process is more fully described below.

To practice the present invention, it is necessary to make the above described measurement sequence at two locations along the direction of the gradient being compensated. As indicated in FIG. 3A, this is accomplished by placing two samples 30 and 30' at two locations and placing respective local coils 31 and 32 around them. While it is possible to perform the above described measurement sequence for one sample and then the other, in the preferred embodiment these two sequences are interlaced. This is accomplished by switching the multiplexer 33 to one coil 31, performing a sequence, and then switching to the other coil 32. This switching is controlled by the pulse control module 120 through a control line 38.

The manner in which the data from the two samples 30 and 30' is acquired is shown in FIGS. 5A and 5B. Referring particularly to FIGS. 3A and 5A, a 90° RF excitation pulse 200 is produced with the multiplexer control line 38 in one state so as to enable local coil 31. Data is then acquired from this same local coil 31 for a 10 millisecond time period. The multiplexer control line 38 is then switched by the pulse control module 120, and 16 milliseconds later a second 90° RF pulse 201 is applied to the local coil 32. The resulting FID from the sample 30' is acquired for 10 milliseconds and then the system is allowed to recover. This sequency is repeated for a total of sixteen times at 122 millisecond intervals.

Referring particularly to FIG. 5B, the set of sixteen pulse sequences indicated in FIG. 5A is repeated after programmed delays following the termination of the gradient pulse. The set of pulse sequences is performed initially at a time interval (T$_3$) of 2 milliseconds following the termination of a 250 millisecond gradient pulse 202. A negative gradient pulse 203 of the same magnitude and duration is applied 2200 milliseconds after the first pulse 202 and an identical set of data acquisition pulse sequences is repeated. As taught in prior application Ser. No. 816,074, now U.S. Pat. No. 4,698,591 the data thus obtained from these two sets of pulse sequences is divided to correct for the resonance frequency offset. This process is repeated for a total of fifteen times with the delay (T$_3$) being increased ($\Delta$T$_3$) by 8.192 milliseconds. The data acquisition windows overlap and interleave to provide NMR data for a window of from 2 msecs. to 1950 msecs. after the termination of the gradient pulse and for both samples 30 and 30'.

The acquired NMR data is sorted and the segments are fitted together to provide sets of data $\Phi_1(t)$ and $\Phi_2(t)$ which indicate the phase of the NMR signals from samples 30 and 30' as a function of time following the termination of the gradient field pulse. The derivative of the signals represented by these sets of data is then taken, the segments are pieced together and the results are normalized by the excitation gradient amplitude. The two resulting data sets are used to calculate the spurious gradient field response G(t) and the spurious spatially invariant field response B$_o$(t) in accordance with the following:

$$d\Phi_1(t)/dt = B_{x1}(t) = B_o(t) + G(t)x_1 \quad (3)$$

$$d\Phi_2(t)/dt = B_{x2}(t) = B_o(t) + G(t)x_2 \quad (4)$$

This yields:

$$G(t) = (B_{x1}(t) - B_{x2}(t))/(x_1 - x_2) \quad (5)$$

$$B_o(t) = (x_1 B_{x2}(t) - x_2 B_{x1}(t))/(x_1 - x_2) \quad (6)$$

Where: B$_{x1}$ and B$_{x2}$ are the measured spurious fields at positions x$_1$ and x$_2$ respectively.

To solve for G(t) and B$_o$(t), it is necessary to precisely measure the distances x$_1$ and x$_2$ from the isocenter. The position of the samples are determined from the spectrum of a gradient refocused spin-echo, as depicted by the sequence in FIG. 5C. The pulse sequence of FIG. 5C includes the initial application of a 90° RF excitation pulse, followed by application of opposite polarity gradient pulses 40 and 42 which produce the spin-echo signal. Gradient pulse 42 is the readout gradient pulse (wherein G$_p$=120 mg/cm, for example). Let G$_p$ be the amplitude of the readout gradient. Then the frequency for the sample at position "x" is $$\omega_o = \gamma G_p x + \Delta\omega \quad (7)$$

$$x = (\omega_o - \Delta\omega)/\gamma G_p \quad (8)$$

where $\Delta\omega$ is a constant offset. The offset frequency is removed by gathering half the gradient recalled echo views with G$_P$ negated and subtracting the frequencies of the two sets. The frequencies are found by a standard thresholded moment analysis of the spectra.

The reason a spin-echo is used to measure "x" instead of geometric means is that (1) the origin (or null point) of the gradient may be difficult to find, and (2) the gradient may not be perfectly linear, especially at the edges of the field of view. In addition, this method self-corrects for errors caused by uncalibrated gain of the field gradient system. Thus, by using magnetic resonance signals to calculate "x", any errors in G$_o$ will be compensated by the same errors in G$_P$.

Having measured x$_1$ and x$_2$, the gradient field response G(t) and the polarizing field response, B$_o$(t) may be calculated in accordance with equations (5) and (6) above. Regression techniques are then employed to fit a series of exponentials to the functions G(t) and B$_o$(t). The amplitudes and time constants ($\alpha_i$ and $\tau_i$) of these exponentials are employed to determine the precise construction of the pre-emphasis filter 24 for the x axis gradient coil 12 and the shim filter 19. In one imaging system it is found that the sum of two or three exponentials with adjustable amplitudes and time constants fit the data quite well. In other applications, fewer or more exponential components may be needed. The techniques used to decide how many terms are needed are well known in the art as disclosed, for example, by P. R. Bevington in his text "Data Reduction and Error Analysis for the Physical Sciences," published in 1969 by McGraw-Hill Book Co., N.Y., pp. 232-235. The precise manner in which the amplitudes ($\alpha_i$) and time constant ($\tau_i$) for each exponential are calculated is described in the above-cited co-pending application Ser. No. 816,074, which is incorporated herein by reference. A set of values ($\alpha_i$, $\tau_i$) for both the gradient field compensation and polarizing field compensation are produced for each gradient field axis (x, y and z in the Cartesian coordinate system) and these are employed in the appropriate filter circuits.

Figure 6:
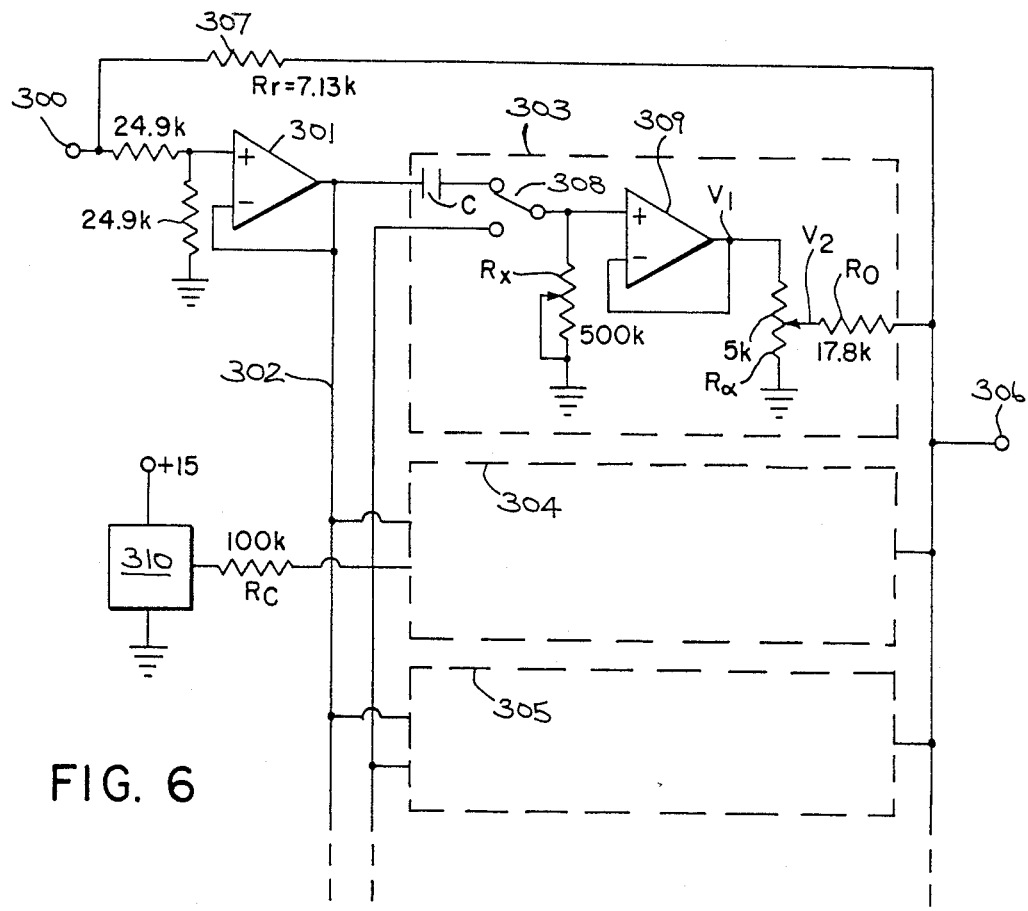
FIG. 6 is an electrical schematic diagram of one exemplary embodiment of a pre-emphasis filter.

Referring to FIG. 6, a preferred embodiment of the compensation filter includes an input terminal 300 which connects to operational amplifier 301. The output of the amplifier 301 connects to bus 302 which serves as the input to a plurality of exponential circuits indicated by the dashed lines 303-305. The outputs of the exponentials circuits 303-305 connect to a common filter output terminal 306, and a feedback resistor 307 connects this filter output 306 back to the input terminal 300. Although three exponential circuits 303-305 are shown, it should be apparent that the number will depend on the results of the MR measurements and the degree of accuracy required to provide adequate results.

Referring still to FIG. 6, each exponential circuit 303–305 includes a coupling capacitor C at its input which connects through a single-pole-double throw switch 308 to an operational amplifier 309. A potentiometer $R_X$ also connects to the input of operational amplifier 309 and it forms an R-C circuit with the capacitor C. A second potentiometer $R_\alpha$ connects to the output of amplifier 309 and its wiper contact connects through a resistor $R_o$ to the filter output terminal 306. The potentiometers $R_X$ and $R_\alpha$ are adjusted to provide the proper time constant $\tau_i$ and overshoot fraction $\alpha_i$. This adjustment is performed by a calibration step in which the switch 308 is toggled to apply a ten volt reference 310 through a resistor $R_C$ to the operational amplifier 309. The potentiometer $R_X$ is then set to provide a predetermined voltage $V_1$ at the output of the operational amplifier 309, and potentiometer $R_\alpha$ is then set to provide a predetermined voltage $V_2$ at its wiper. The predetermined voltages $V_1$ and $V_2$ are calculated using the values of $\tau_i$ and $\alpha_i$, as well as the values of the circuit components as follows:

$$V_1 = 10\tau_1/C/(\tau_1/C + R_C)$$

$$V_2 = 2V_1\alpha_1 R_o/R_r$$

Each exponential circuit 303–305 is separately calibrated in this fashion and the switch 308 is returned to its operating position. The compensation filter, therefore, includes one or more exponential circuits which provide the compensation to the signal applied to its input 300.

Figure 7:
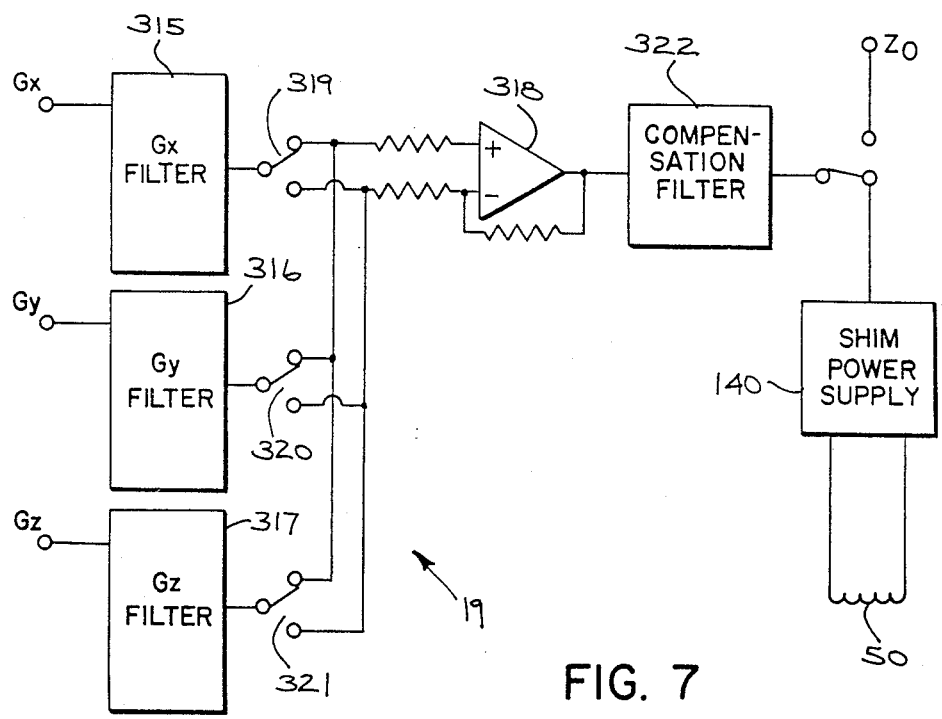
FIG. 7 is a schematic diagram of the shim filter which forms part of the circuit in FIG. 2C.

As indicated above with reference to FIG. 2B, the compensation filter circuits such as that in FIG. 6 are also employed as the pre-emphasis filter 24 for each gradient amplifier 130, 132 and 134. In addition, and as shown in FIG. 7, the compensation filter circuits such as that in FIG. 6 are also employed in the shim filter 19. More specifically, the compensation filter is employed as a $G_x$ filter 315, a $G_y$ filter 316 and a $G_z$ filter 317. The $B_o(t)$ impulse response is measured as described above for each calibration gradient pulse $G_x$, $G_y$ and $G_z$; and the resulting exponential circuit values $\tau_i$ and $\alpha_i$ for each axis are entered into the respective filters 315–317. Once calibrated and adjusted, the inputs of the filters 315–317 are driven by the respective gradient pulse signals $G_x$, $G_y$ and $G_z$ from the pulse control module 120, and their outputs are summed together at an operational amplifier 318. Switches 319–321 enable the polarity of the axis compensation signals to be switched with respect to each other, since the effect of gradient pulses on the spatially homogeneous field may have either polarity.

The output of amplifier 318 is a compensation signal which offsets spurious changes in the $B_o$ field caused by gradient pulses. Unfortunately, the $z_o$ shim coil to which this compensation signal is applied is itself coupled to surrounding structures and does not respond ideally to the applied compensation signal. Consequently, the shim coil 50 must also be compensated so that it responds properly to the output of amplifier 318. This is accomplished by applying a pulse $z_o$ to the input of the shim power supply 140 and acquiring MR data as described above to measure the impulse response. From this MR data the exponential circuit parameters $\tau_i$ and $\alpha_i$ are determined and preset into a compensation filter 322 which connects between the amplifier 318 and the shim power supply 140. Thus, the filters 315–317 compensate for the effects caused by gradient pulses and the compensation filter 322 compensates the imperfect impulse response of the $z_o$ shim coil itself. The net result is that the polarizing field $B_o$ is compensated for any cross coupling which may occur between the magnetic field gradients and the polarizing magnetic field.

Although one embodiment of the invention has been described above which uses an exponential pre-emphasis filter, it will be recognized that other filter implementations (such as active filter designs) may be devised by those skilled in the art. Additionally, embodiments are envisioned in which following measurement of the decaying spurious component, pre-emphasis (or predistortion) of the signal energizing the gradient coil and the $z_o$ shim coil may be achieved using software or digital techniques without the aid of analog pre-emphasis filters.

In accordance with such software techniques, for example, once G(t) is found using equation (5), it may be applied by numerical convolution techniques to the data used to generate the gradient pulse waveform, prior to applying the gradient pulse waveform to the gradient amplifiers.

Thus, let $w(t_k)$ be the desired gradient waveform for a gradient to be applied along a particular axis. Then the corrected waveform which must be applied to the gradient amplifier for the actual response to be corrected is:

$$W_c(t_k) = \sum_{j=1}^{N} W(t_{k-j}) \kappa(t_j)$$

where N denotes the number of points in the sampled filter kernel k. This operation may either be performed by a computer (such as computer 101, FIG. 1) before the waveform is stored in a readout memory, or it may be performed in nearly real time by computation from a stored wave $w(t_k)$.

While this invention has been described with reference to particular embodiments and examples, other modifications and variations will occur to those skilled in the art in view of the above teachings.

We claim:

1. A method for MR scanner magnetic field compensation comprising the steps of:
    (a) positioning an NMR active sample at a first position with respect to the isocenter of an MR scanner apparatus;
    (b) applying a polarizing magnetic field to the sample;
    (c) applying a gradient pulse along one axis;
    (d) irradiating the sample with an RF excitation pulse within a predetermined time following application of said gradient pulse so as to generate an NMR signal;
    (e) measuring data indicative of the phase angle of the NMR signal and indicative of the field generated by the gradient pulse at said first position as a function of time following the application of the gradient pulse;
    (f) positioning an NMR active sample at a second position with respect to the isocenter of the MR scanner apparatus;
    (g) repeating steps (b) through (d);
    (h) measuring data related to the phase angle of the NMR signal and indicative of the field generated by the gradient pulse at said second position; and
    (i) calculating from the measured data the compensation values which are employed with the means for producing the polarizing magnetic field to offset spurious effects induced in the polarizing magnetic field by said magnetic field gradient pulses.

2. The method as recited in claim 1 in which steps (a) through (i) are repeated, but the gradient pulse applied in step (b) is along another axis, and the compensation values calculated in step (i) compensate for spurious effects caused by the gradient pulse along said another axis.

3. The method as recited in claim 1 in which the means for producing the polarizing magnetic field includes a compensation filter and the compensation values calculated in step (i) are exponential circuit parameters for a compensation filter.

4. The method as recited in claim 1 which includes the further steps of:
   (j) applying a magnetic field pulse to the sample with said means for producing the polarizing magnetic field;
   (k) repeating step (d);
   (l) measuring data indicative of the phase angle of the NMR signals and indicative of the field generated by said magnetic field pulse at the position of the sample as a function of time following the application of the magnetic field pulse; and
   (m) calculating from the data measured in step (1) compensation values which are employed with the means for producing the polarizing magnetic field to offset spurious effects induced in the polarizing magnetic field by said magnetic field pulse.

5. The method as recited in claim 1, in which the measuring steps (e) and (h) each includes the step of calculating the derivative of the measured phase angle of the NMR signal with respect to time.

6. The method as recited in claim 1 in which the calculation recited in step (i) includes arithmetically combining the data sets acquired in steps (e) and (h) and employing a regression technique to fit a series of exponentials to the resulting combined data.

7. In a nuclear magnetic resonance system including a magnet for developing a main polarizing magnetic field and magnetic field gradient apparatus for producing magnetic field gradient pulses, a shim coil apparatus comprising:
   a shim coil for applying a substantially spatially homogeneous magnetic field to the main polarizing magnetic field; and
   means coupled to the shim coil, for energizing said shim coil, including means for receiving a signal indicative of the production of magnetic field gradient pulses, and means for applying a current component to the shim coil to compensate the main polarizing magnetic field for the spurious effects induced therein by said magnetic field gradient pulses.

8. The shim coil apparatus as recited in claim 7 in which the means for applying a current component to the shim coil includes a circuit having a resistor and capacitor which together have a time constant substantially the same as a time constant associated with the induced spurious effects.

9. The shim coil apparatus as recited in claim 8, in which the magnetic field gradient apparatus produces magnetic field gradient pulses aligned along each of a plurality of axes, in which the shim coil apparatus receives separate signals indicative of the production of magnetic field gradient pulses for each of said axes, and the circuit has a separate resistor and capacitor associated with each axis and the time constant of each resistor-capacitor is substantially the same as a time constant associated with the spurious effects in the polarizing magnetic field produced by the magnetic field gradient pulses.

10. The shim coil apparatus as recited in claim 7, in which the means coupled to the shim coil also includes means for receiving the compensated current component and altering said current component to further compensate the main polarizing magnetic field for spurious effects induced therein by changes in the level of the main polarizing magnetic field.

* * * * *